US009066419B2

(12) United States Patent
Maeda

(10) Patent No.: US 9,066,419 B2
(45) Date of Patent: Jun. 23, 2015

(54) MULTILAYER WIRING SUBSTRATE

(71) Applicant: NGK SPARK PLUG CO., LTD., Nagoya, Aichi (JP)

(72) Inventor: Shinnosuke Maeda, Nagoya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 14/240,153

(22) PCT Filed: Mar. 20, 2013

(86) PCT No.: PCT/JP2013/001885
§ 371 (c)(1),
(2) Date: Feb. 21, 2014

(87) PCT Pub. No.: WO2013/161181
PCT Pub. Date: Oct. 31, 2013

(65) Prior Publication Data
US 2014/0216796 A1  Aug. 7, 2014

(30) Foreign Application Priority Data
Apr. 26, 2012  (JP) ................. 2012-101907

(51) Int. Cl.
*H05K 1/03* (2006.01)
*H05K 1/02* (2006.01)
(Continued)

(52) U.S. Cl.
CPC *H05K 1/02* (2013.01); *H05K 3/421* (2013.01); *H05K 3/4644* (2013.01); *H05K 2201/09509* (2013.01); *H05K 2201/0959* (2013.01); *H05K 2201/2072* (2013.01); *H05K 2201/029* (2013.01)

(58) Field of Classification Search
USPC ............................. 174/255, 257
See application file for complete search history.

(56) References Cited

U.S. PATENT DOCUMENTS 7,323,238 B2 *  1/2008  Kondo et al. ............... 428/209
2008/0257591 A1  10/2008  Ikeda
(Continued)

FOREIGN PATENT DOCUMENTS

JP  2001-257470 A  9/2001
JP  2005-183548 A  7/2005
(Continued)

OTHER PUBLICATIONS

ISA/JPO, International Search Report issued in corresponding international application No. PCT/JP2013/001885, mailed Jun. 11, 2013.

*Primary Examiner* — Andargie M Aychillhum
(74) *Attorney, Agent, or Firm* — Stites & Harbison PLLC; Jeffrey A. Haeberlin; James R. Hayne

(57) ABSTRACT

To provide a multilayer wiring board that ensures sufficient close contact strength between a conformal type conductor and a resin insulating layer. A multilayer wiring board includes a multilayered construction where a plurality of resin insulating layers and a plurality of conductor layers are alternately layered. In each of a plurality of via holes formed in the resin insulating layers, a conformal via conductor is formed to electrically connect between the conductor layers. Filling up parts of the resin insulating layers layered at upper layer side inside of the conformal via conductor forms an anchor portion. The lower end side of the anchor portion bulges larger than the upper end side in the radially outward direction of the via hole.

6 Claims, 5 Drawing Sheets

(51) Int. Cl.
*H05K 3/46* (2006.01)
*H05K 3/42* (2006.01)

(56) References Cited

U.S. PATENT DOCUMENTS

2009/0229874 A1* 9/2009 Katagiri et al. ............... 174/262
2010/0163297 A1   7/2010 Kajaihara 2011/0232948 A1   9/2011 Sato et al.

FOREIGN PATENT DOCUMENTS

| | | |
|---|---|---|
| JP | 2007-227512 A | 9/2007 |
| JP | 2008-141136 A | 6/2008 |
| JP | 2011-205069 A | 10/2011 |
| WO | 20101076875 A1 | 7/2010 |

* cited by examiner

MULTILAYER WIRING SUBSTRATE

TECHNICAL FIELD

The present invention relates to a multilayer wiring board with a multilayered construction in which a plurality of resin insulating layers and a plurality of conductor layers are alternately layered.

BACKGROUND ART

Recently, along with downsizing of an electric device, an electronic device, or the like, a compact and high density multilayer wiring board or the like to be mounted on these devices has been demanded. As this multilayer wiring board, a wiring board that is fabricated with what is called a build up method where a plurality of resin insulating layers and a plurality of conductor layers are alternately and integrally layered, is put to practical use (see, for example, Patent Documents 1 and 2). In the multilayer wiring board, a conductor layer below a resin insulating layer and a conductor layer above the resin insulating layer are connected through a via conductor formed inside of the resin insulating layer.

Via conductors to connect each conductor layer include a filled via conductor and a conformal via conductor. The filled via conductor is a type of via without a depressed portion where a via hole formed in a resin insulating layer is completely filled by a plating layer. On the other hand, the conformal via conductor is a type of via where a plating layer is formed along a shape of a via hole and therefore the via hole is not completely filled up with the plating layer, thus the conformal via conductor has a depressed portion.

In a multilayer wiring board disclosed in Patent Document 1, the resin insulating layer has a hourglass-shaped via hole that penetrates the resin insulating layer to have a reduced diameter at the center in the thickness direction. A filled via conductor is formed to fill up this via hole. In a multilayer wiring board disclosed in Patent Document 2, the resin insulating layer has a via hole with an inverted truncated cone shape that penetrates to decrease in diameter from a top surface toward a bottom surface. A conformal via conductor is formed in the via hole. Then, the conformal via conductor has a depressed portion inside which a part of the resin insulating layer at an upper layer side is filled up.

The multilayer wiring board of Patent Document 2 includes a core substrate with a front face and a reverse face. On these surfaces of the core substrate, buildup layers, which are multilayered by alternately layering a plurality of resin insulating layers and a plurality of conductor layers, are formed. In this multilayer wiring board, the core substrate is formed to be thick, compared with the resin insulating layer constituting the buildup layer. In view of this, the core substrate has a straight through hole formed by drilling, and a through-hole conductor is formed inside of this through hole. Then, the through-hole conductor electrically connects the conductor layers formed on the front face and the reverse face of the core substrate. The through-hole conductor is internally filled with a filler such as epoxy resin.

CITATION LIST

Patent Documents

Patent Document 1: JP-A-2011-205069
Patent Document 2: JP-A-2008-141136

SUMMARY OF INVENTION

Technical Problem

Now, the via hole of the resin insulating layer is usually formed by laser hole machining to have a shape that decreases in diameter in one direction. In the case where a conformal via conductor is formed inside of the via hole, a plating condition is set to form a plating layer with a uniform thickness on an inner wall surface of the via hole. In this case, the conformal via conductor has a depressed portion formed inside of the conformal via conductor. The depressed portion has a shape that gradually increases in diameter toward an opening side. Therefore, if the resin insulating layer were filled in the depressed portion, sufficient close contact between the insulating layer and the via conductor could not be ensured, thus the reliability is degraded. The through-hole conductor is formed in a through hole with a straight shape. Therefore, even with the through-hole conductor, a filler filled inside of the through-hole conductor cannot ensure a sufficient close contact.

The present invention has been conceived to solve the above-mentioned problems, and an object of the invention is to provide a multilayer wiring board that ensures sufficient close contact strength between a conformal type conductor and a resin insulating layer.

Solution to Problem

As means to solve the above-identified problem (means 1), a multilayer wiring board is provided. The multilayer wiring board includes a multilayered construction, a conformal type conductor, and an anchor portion. The multilayered construction includes a plurality of resin insulating layers and a plurality of conductor layers that are alternately layered. At least one layer among the resin insulating layers has a plurality of through holes. The conformal type conductor is disposed in each of the plurality of through holes. The conformal type conductor electrically connects between the conductor layers. The anchor portion is formed by filling up a part of the resin insulating layer layered at an upper layer side, inside of the conformal type conductor. The anchor portion includes a lower end side and an upper end side. The lower end side bulges larger than the upper end side in a radially outward direction of the through hole.

At least one layer among the resin insulating layers may include an inorganic fiber cloth in an inner layer portion of resin insulating material. A projecting portion may be formed on an inner wall surface of the through hole disposed in the resin insulating layer and may be a projection of a tip end of an inorganic fiber constituting the inorganic fiber cloth. The anchor portion may be narrowly constricted at a position corresponding to the projecting portion. Thus, the projecting portion of the inorganic fiber cloth surely secures the conformal type conductor to prevent the conformal type conductor from coming off from inside of the through hole. The narrowly constricted shape latches the anchor portion to the conformal type conductor, thus the resin insulating layer is surely prevented from delaminating. Although the inorganic fiber cloth is not included in the inner layer portion of the resin insulating material, it is possible to secure the anchor portion inside of the conformal type conductor. However, the construction with the tip end of the inorganic fiber projected from the inner wall surface of the through hole increases the strength of the portion in contact with the anchor portion, thus the anchor portion is more surely secured.

The through hole may have a minimum diameter at an opening diameter defined by the projecting portion of the inorganic fiber cloth. Thus, the projecting portion of the inorganic fiber cloth surely secures the conformal type conductor inside of the through hole.

The conformal type conductor may be formed in a uniform thickness along the inner wall surface of the through hole, or the conformal type conductor may include a lower side portion and an upper side portion. The lower side portion is in contact with a lower end side of the anchor portion. The lower side portion has a smaller thickness than the upper side portion. The conformal type conductor may bulge in the radially inward direction of the through hole at approximately the center portion in the penetrating direction of the through hole. Thus, the conformal type conductor can ensure the large space inside at the lower side portion to surely form the anchor portion that bulges at the lower end side.

The lower end side of the anchor portion may have any configuration as long as the lower end side of the anchor portion is thick to ensure the anchor effect. The thickness is not especially limited. The lower end side of the anchor portion may bulge to have the thickness equal to or more than twice the narrowly constricted portion, for example. This can more surely secure the anchor portion inside of the conformal type conductor.

In the present invention, the conformal type conductor is a conductor that is formed in a predetermined thickness along a shape of the through hole inside of the through hole penetrating one or a plurality of the resin insulating layers. Concrete examples of this conformal type conductor includes the conformal via conductor and the through-hole conductor. The conformal type conductor is usually formed of a copper plating layer. The conformal type conductor may be formed of a plating layer other than copper (such as nickel plating layer and gold plating layer), or may be formed with a method other than the plating such as filling up of a conductive paste.

The resin insulating material constituting the resin insulating layer may be selected as necessary considering insulation property, heat resistance, humidity resistance, and similar property. The preferred examples of resin insulating material include thermosetting resin such as epoxy resin, phenolic resin, urethan resin, silicone resin, and polyimide resin, and thermoplastic resin such as polycarbonate resin, acrylic resin, polyacetal resin, and polypropylene resin.

Advantageous Effects of Invention

According to the invention described as means 1, a part of the resin insulating layer at the upper layer side is filled up inside of the conformal type conductor to form the anchor portion. This anchor portion bulges larger at the lower end side than at the upper end side in the radially outward direction of the through hole. Thus, the anchor portion functions as a wedge to be surely secured inside of the conformal type conductor, so as to surely prevent the resin insulating layer from delaminating at the upper portion of the conformal type conductor.

DESCRIPTION OF EMBODIMENTS

Hereinafter, a detailed description will be given of an embodiment embodying the present invention as a multilayer wiring board with reference to the drawings.

Figure 1:
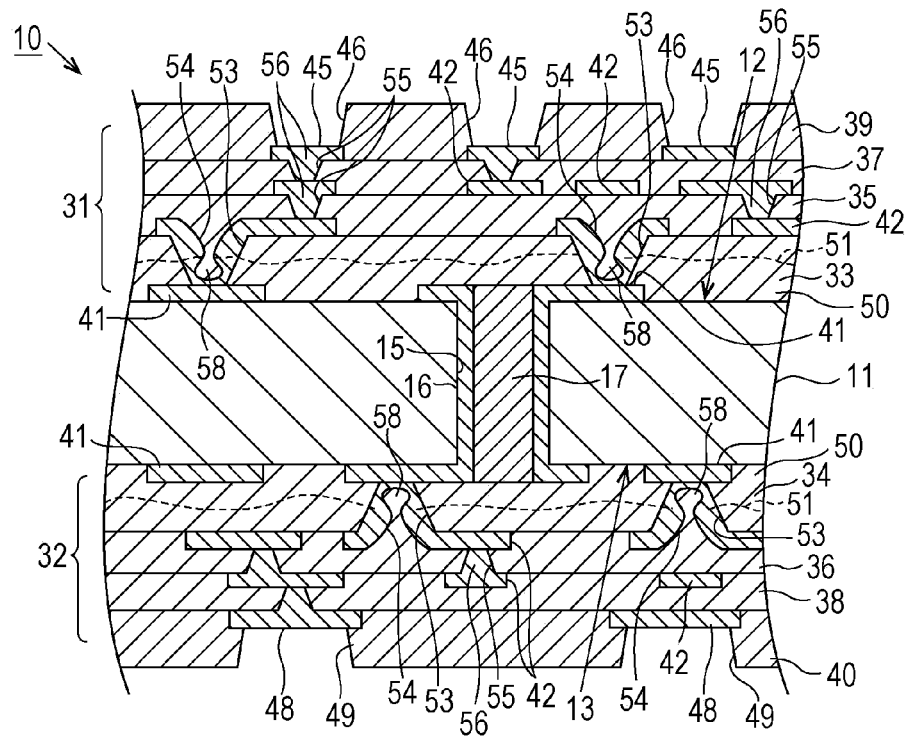
FIG. 1 is a sectional view illustrating a schematic configuration of a multilayer wiring board according to an embodiment.

As illustrated in FIG. 1, a multilayer wiring board 10 according to an embodiment of the present invention includes a core substrate 11, a first buildup layer 31, and a second buildup layer 32. The first buildup layer 31 is formed on a core principal surface 12 (top surface in FIG. 1) of the core substrate 11. The second buildup layer 32 is formed on a core reverse face 13 (bottom surface in FIG. 1) of the core substrate 11.

The core substrate 11 is constituted of, for example, a resin insulating material (glass epoxy material) where an epoxy resin is impregnated in a glass cloth as a reinforcing material. The core substrate 11 has holes for through hole 15 (through hole) that penetrate in the thickness direction at a plurality of positions in the core substrate 11, and through-hole conductors 16 are formed inside of these holes for through hole 15. The through-hole conductor 16 connects the core principal surface 12 side and the core reverse face 13 side of the core substrate 11. A filler 17 such as an epoxy resin is filled up inside of the through-hole conductor 16. On the core principal surface 12 and the core reverse face 13 of the core substrate 11, a conductor layer 41 made of copper is pattern formed, and each conductor layer 41 is electrically connected to the through-hole conductor 16.

The first buildup layer 31, which is formed on the core principal surface 12 of the core substrate 11, has a buildup construction where a plurality of resin insulating layers 33, 35, and 37 and a plurality of conductor layers 42 made of copper are alternately layered. In the first buildup layer 31, the resin insulating layer 33 at inner layer side is arranged at the core principal surface 12 side. The resin insulating layer 33 is formed to have a thickness larger than those of the other resin insulating layers 35 and 37 at the upper layer side. The resin insulating layer 33 at inner layer side includes a glass cloth 51 as an inorganic fiber cloth in the inner layer portion of a resin insulating material 50 made of an epoxy resin. The resin insulating layer 33 has a thickness of approximately 100 μm, while the glass cloth 51 has a thickness of approximately 50 μm. On the other hand, the resin insulating layers 35 and 37 at the upper layer side are resin insulating layers made of epoxy resin and do not include the glass cloth 51. These resin insulating layers 35 and 37 have a thickness of approximately 50 μm.

At a plurality of positions on the resin insulating layer 37, terminal pads 45 are formed in an array shape. Furthermore, the resin insulating layer 37 has a top surface that is approximately entirely covered with a solder resist 39. Opening portions 46 to expose the terminal pads 45 are formed at predetermined positions in the solder resist 39. Then, the terminal pads 45 exposed from the opening portions 46 are electrically connected to connecting terminals of a semiconductor chip via a solder bump (not shown). A via hole 53 and a conformal via conductor 54 are formed in the resin insulating layer 33 at the inner layer side. Furthermore, a via hole 55 and a filled via conductor 56 are formed in the resin insulating layers 35 and 37 at the outer layer side. The respective via conductors 54 and 56 mutually electrically connect the conductor layers 41 and 42 and the terminal pad 45.

The second buildup layer 32 formed on the core reverse face 13 of the core substrate 11 has approximately the same construction as the above-described first buildup layer 31. That is, the second buildup layer 32 has a buildup construction where a plurality of resin insulating layers 34, 36, and 38 and the plurality of conductor layers 42 are alternately layered. In the second buildup layer 32, the resin insulating layer 34 at inner layer side is arranged at the core reverse face 13 side. The resin insulating layer 34 is formed to have a thickness larger than those of the other resin insulating layers 36 and 38 at the upper layer side. The resin insulating layer 34 at the inner layer side includes the glass cloth 51 in the inner layer portion of the resin insulating material 50 made of epoxy resin. The resin insulating layer 34 has a thickness of approximately 100 μm while the glass cloth 51 has a thickness of approximately 50 μm. On the other hand, the resin insulating layers 36 and 38 at the upper layer side are resin insulating layers made of epoxy resin and do not include the glass cloth 51. These resin insulating layers 36 and 38 have a thickness of approximately 50 μm.

At a plurality of positions on a bottom surface of the resin insulating layer 38, BGA pads 48 are formed in an array shape. The resin insulating layer 38 has a bottom surface that is approximately entirely covered with a solder resist 40. Opening portions 49 to expose the BGA pads 48 are formed at predetermined positions in the solder resist 40. The BGA pads 48 exposed from the opening portions 49 are electrically connected to a motherboard (outside substrate) via a solder bump (not shown). In the resin insulating layer 34 at the inner layer side, the via hole 53 and the conformal via conductor 54 are formed. Furthermore, in the resin insulating layers 36 and 38 at the outer layer side, the via hole 55 and the filled via conductor 56 are formed. The respective via conductors 54 and 56 mutually electrically connect the conductor layers 41 and 42 and the BGA pad 48.

Next, a detail of a configuration of the conformal via conductor 54 (conformal type conductor) formed in the resin insulating layers 33 and 34 at the inner layer side will be described with reference to FIG. 2.

Figure 2:
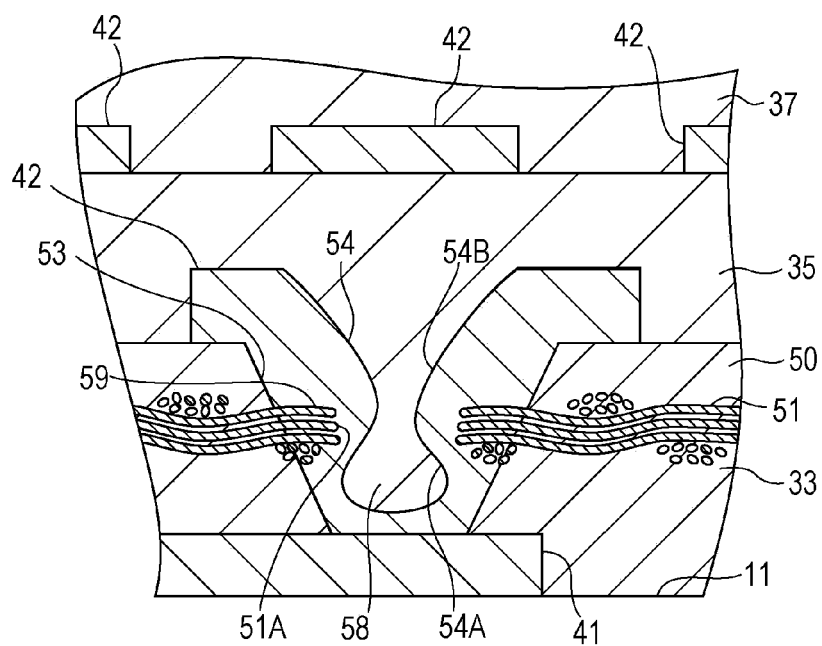
FIG. 2 is an enlarged sectional view illustrating a via hole and a via conductor in a resin insulating layer.

As illustrated in FIG. 2, the via hole 53 formed in the resin insulating layer 33 is a through hole that gradually increases in diameter from the inner layer side toward the outer layer side. In this via hole 53, the conformal via conductor 54, which electrically connects between the conductor layers 41 and 42, is disposed along a shape of the via hole 53. In the resin insulating layer 33, the glass cloth 51 is disposed at approximately the center portion in the thickness direction. Then, tip ends 51A of glass fibers, which constitute the glass cloth 51, project from an inner wall surface of the via hole 53 and cut into a side portion of the conformal via conductor 54. While in this embodiment, the glass cloth 51 is disposed at approximately the center portion in the thickness direction, the glass cloth 51 may be disposed at the upper layer side portion with respect to the center portion.

The via hole 53 has the minimum diameter in the opening diameter defined by a projecting portion 59 of the glass cloth 51. In the via hole 53, the conformal via conductor 54 is formed along the projecting portion 59 of the glass cloth 51 to cover a surface of the projecting portion 59. Therefore, the conformal via conductor 54 has a shape where an inner side surface at a position corresponding to the projecting portion 59 of the glass cloth 51 bulges toward radially inward direction of the via hole 53.

Then, a part of the resin insulating layer 35 layered at upper layer side is filled up inside of the conformal via conductor 54 so as to form an anchor portion 58. The anchor portion 58 is narrowly constricted at the position corresponding to the projecting portion 59 of the glass cloth 51, and bulges larger at the lower end side than at the upper end side in the radially outward direction of the via hole 53. In this embodiment, the anchor portion 58 has a thickness at the lower end side equal to or more than twice the narrowly constricted portion. Since the projecting portion 59 of the glass cloth 51 is disposed at approximately the center portion in the thickness direction of the resin insulating layer 33, the anchor portion 58 is narrowly constricted at approximately the center portion. In the case where the glass cloth 51 is disposed at the upper layer side portion with respect to the center portion in the resin insulating layer 33, the projecting portion 59 of the glass cloth 51 is displaced toward the upper layer side. In this case, forming the narrowly constricted portion at the upper layer side in the anchor portion 58 enlarges the size at the lower end side.

Inside of the via hole 53, the conformal via conductor 54 includes a lower side portion 54A and an upper side portion 54B. The lower side portion 54A in contact with the lower end side of the anchor portion 58 is formed to have a smaller thickness than the upper side portion 54B. That is, the conformal via conductor 54 is formed to have a small thickness at the lower layer side and a larger thickness at the upper layer side with respect to the projecting portion 59 of the glass cloth 51. As a result, inside of the conformal via conductor 54, the space expands at the lower side portion inside which the lower end side of the anchor portion 58 is formed.

Next, a method for fabricating the multilayer wiring board 10 according to the embodiment of the present invention will be described.

First, a copper-clad laminate, which includes a base material of glass epoxy with copper foils applied on both the surfaces, is prepared. Then, drilling using a drilling machine is performed to preliminarily form a through hole 15 that penetrates the front and reverse faces of the copper-clad laminate at a predetermined position. Then, by performing electroless copper plating and electrolytic copper plating on the inner surface of the through hole 15 of the copper-clad laminate, a through-hole conductor 16 is formed in the through hole 15.

Figure 3:
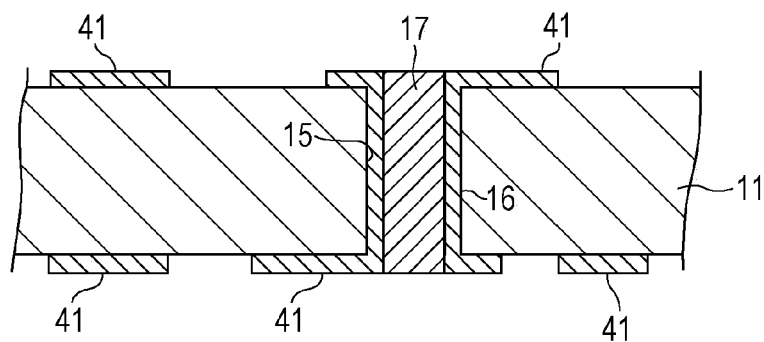
FIG. 3 is an explanatory view illustrating a core substrate forming process in a method for fabricating the multilayer wiring board.

Then, the hollow portion of the through-hole conductor 16 is filled with an insulating resin material (epoxy resin) to form the filler 17. Furthermore, a patterning process with, for example, a subtractive method on a copper foil of the copper-clad laminate and a copper plating layer on the copper foil is performed. As a result, as illustrated in FIG. 3, the core substrate 11 with the through-hole conductor 16 and conductor layer 41 is obtained.

Then, the first buildup layer 31 on the core principal surface 12 of the core substrate 11 and the second buildup layer 32 on the core reverse face 13 of the core substrate 11 are formed by performing the buildup process.

Figure 4:
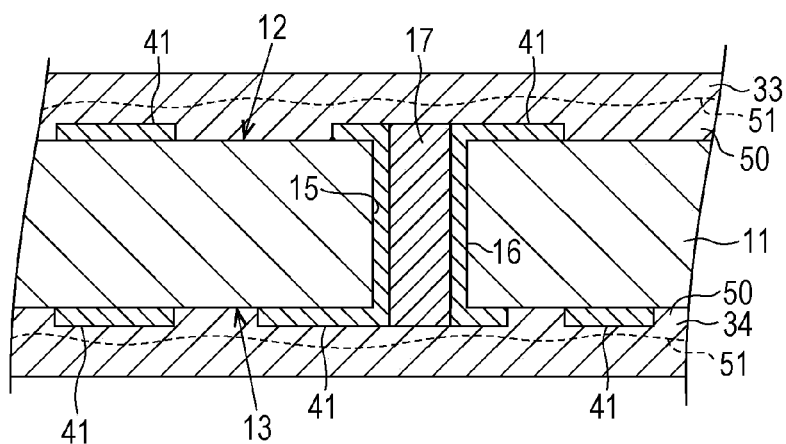
FIG. 4 is an explanatory view illustrating an insulating layer arrangement process in the method for fabricating the multilayer wiring board.

Specifically, as illustrated in FIG. 4, on the core principal surface 12 and the core reverse face 13 with the respective conductor layers 41, the sheet-shaped resin insulating layers 33 and 34 are disposed and then laminated. The resin insulating layers 33 and 34 are constituted to include the glass cloth 51 in the resin insulating material 50.

Then, by performing, for example, laser hole machining using a carbon dioxide laser ($CO_2$ laser), the via hole 53 is formed in a predetermined position of the resin insulating layers 33 and 34. At this time, the glass cloth 51 inside of the resin insulating layers 33 and 34 is also burned down by the laser hole machining to be cut. Here, since the resin insulating material 50 has a higher energy absorption rate of the carbon dioxide laser than the glass cloth 51, a part of the glass cloth 51 remains projected from the inner wall surface of the via hole 53.

Figure 5:
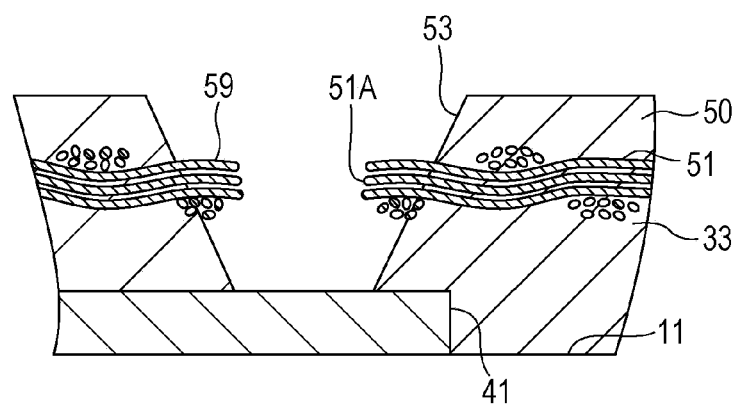
FIG. 5 is an explanatory view illustrating a via hole forming process in the method for fabricating the multilayer wiring board.

Furthermore, a desmear process to remove smear inside each of the via holes 53 is performed. This desmear process selectively removes epoxy resin at the inner wall surface inside of the via hole 53 to retreat the inner wall surface, thus the inner wall surface is enlarged in the radial direction. Accordingly, as illustrated in FIG. 5, this allows the tip end 51A of the glass fiber constituting the glass cloth 51 to project from the inner wall surface of the via hole 53, thus the projecting portion 59 is formed. In this state, the opening diameter defined by the projecting portion 59 of the glass cloth 51 is the minimum diameter inside of the via hole 53.

Figure 6:
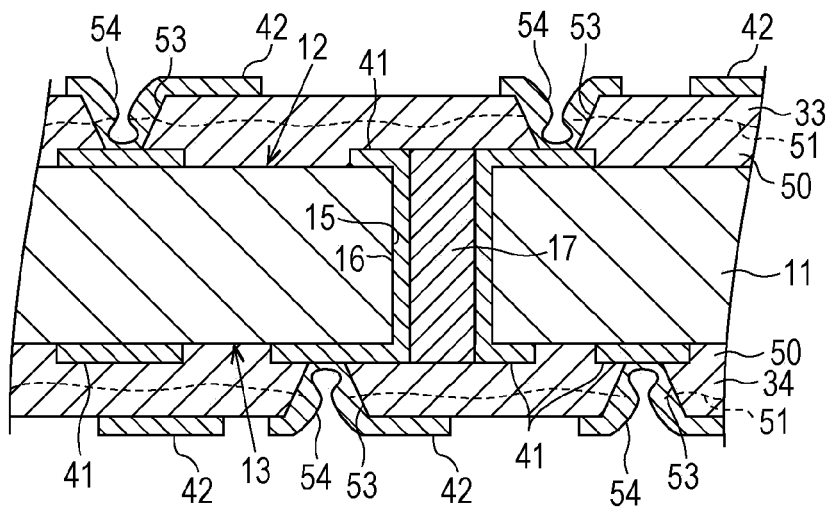
FIG. 6 is an explanatory view illustrating a via conductor forming process in the method for fabricating the multilayer wiring board.

After the desmear process, a plating is performed to form the conformal via conductor 54 in each via hole 53. More specifically, by performing electroless copper plating, an electroless plating layer with a predetermined thickness (specifically, for example, a thickness of approximately 0.1 μm to 1 μm) is formed on a surface of each via hole 53 and a surface of the glass cloth 51. Subsequently, by performing electrolytic copper plating, the conformal via conductor 54 is formed in the via hole 53. Furthermore, by performing an etching with a known method (such as a semi-additive method), the conductor layer 42 is pattern formed on the resin insulating layers 33 and 34 (See FIG. 6).

Figure 7:
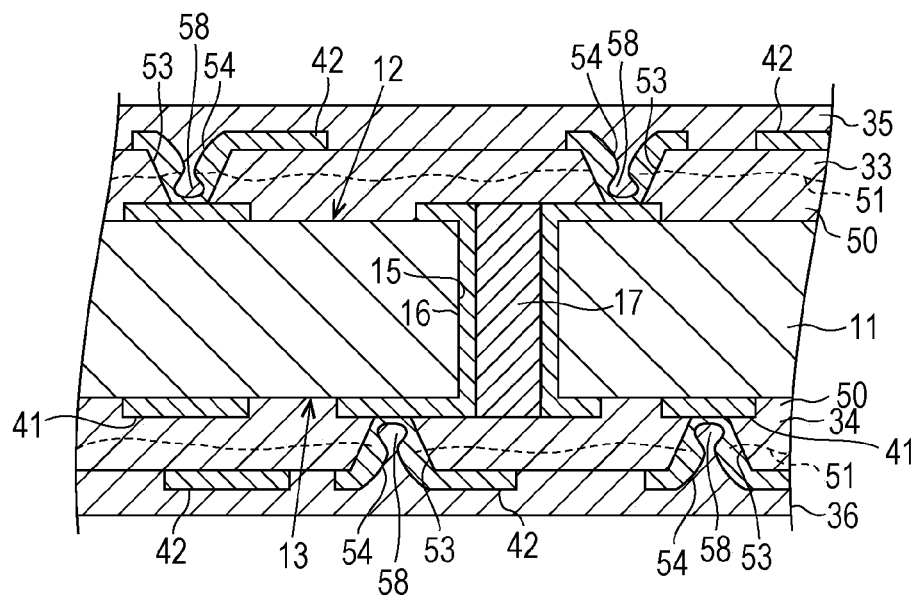
FIG. 7 is an explanatory view illustrating a buildup process in the method for fabricating the multilayer wiring board.

Next, on the resin insulating layers 33 and 34 with the conductor layer 42, sheet-shaped resin insulating layers 35 and 36, which are constituted without including the glass cloth 51, are disposed and then laminated (See FIG. 7). At this time, parts of the resin insulating layers 35 and 36 are filled up inside of the conformal via conductor 54 to form the anchor portion 58.

Then, by performing, for example, laser hole machining using a carbon dioxide laser, the via hole 55 is formed in a predetermined position of the resin insulating layers 35 and 36. The resin insulating layers 35 and 36 have a smaller thickness than the resin insulating layers 33 and 34 and do not include the glass cloth 51. In view of this, when the via hole 55 is formed, the laser hole machining is performed with a low power carbon dioxide laser compared with the formation of the above-described via hole 53.

Next, after a desmear process to remove smear inside each of the via holes 55 is performed, electroless copper plating and electrolytic copper plating in accordance with a known method are performed to form the filled via conductor 56 in each via hole 55. Furthermore, by performing an etching with a known method (such as a semi-additive method), the conductor layer 42 is pattern formed on the resin insulating layers 35 and 36.

Figure 8:
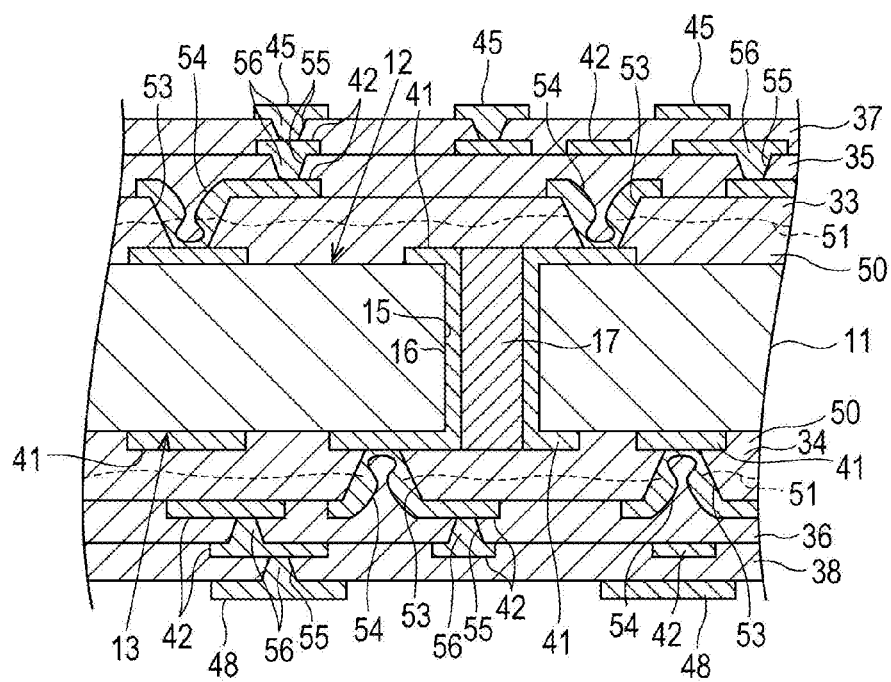
FIG. 8 is an explanatory view illustrating the buildup process in the method for fabricating the multilayer wiring board.

The other resin insulating layers 37 and 38 and the conductor layer 42 are also formed with a method similar to the method for the above-described resin insulating layers 35 and 36 and the conductor layer 42, and laminated on the resin insulating layers 35 and 36 (See FIG. 8). Here, the plurality of terminal pads 45 are formed on the resin insulating layer 37, while the plurality of BGA pads 48 are formed on the resin insulating layer 38.

Next, by applying and hardening a photosensitivity epoxy resin over the resin insulating layers 37 and 38, the solder resists 39 and 40 are formed. Then, by performing exposure and development with a predetermined mask is disposed, the opening portions 46 and 49 are formed in the solder resists 39 and 40. The above-described fabricating process fabricates the multilayer wiring board 10 illustrated in FIG. 1.

Figure 9:
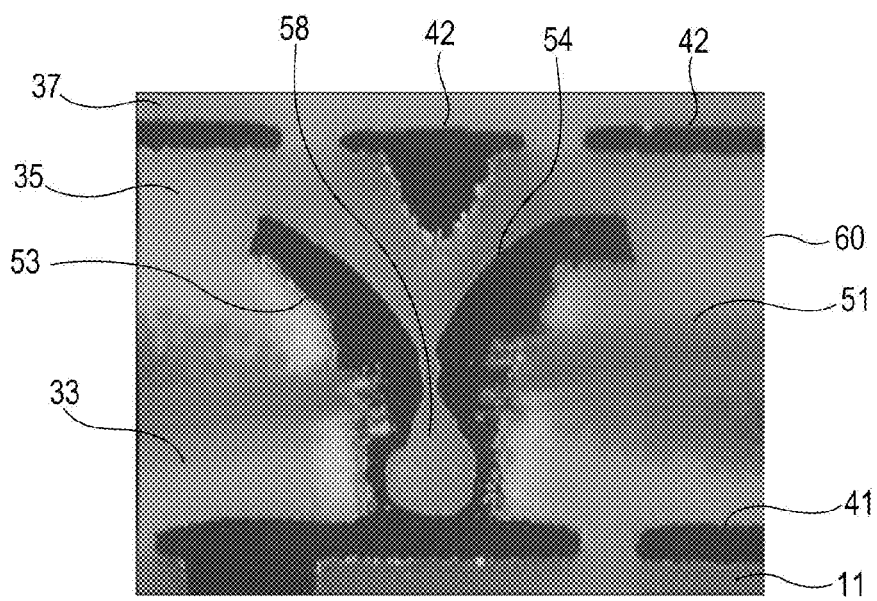
FIG. 9 is an explanatory view illustrating a photomicrograph of the via hole and the via conductor of the embodiment.

The present inventor cuts the multilayer wiring board 10, which is fabricated by the above-described fabricating method, along the axial line of the conformal via conductor 54 in the thickness direction to observe the cut surface of the conformal via conductor 54 through an optical microscope. FIG. 9 indicates an optical photomicrograph 60 of the cut surface of the conformal via conductor 54.

As illustrated in FIG. 9, in the via hole 53, the glass cloth 51 projects and cuts into the side portion of the conformal via conductor 54. It was confirmed that the anchor portion 58 is formed inside of the conformal via conductor 54 without gap to ensure a sufficiently close contact between the conformal via conductor 54 and the anchor portion 58. Furthermore, the anchor portion 58 is narrowly constricted at the position corresponding to the projecting portion of the glass cloth 51, and has a thickness at the lower end side equal to or more than twice the constricted portion.

Accordingly, the embodiment ensures the following effects.

(1) In the multilayer wiring board 10 according to the embodiment, parts of the resin insulating layers 35 and 36 at the upper layer side are filled up inside of the conformal via conductor 54 to form the anchor portion 58, and the anchor portion 58 bulges in the radially outward direction of the via hole 53 at the lower end side. This surely secures the anchor portion 58 inside of the conformal via conductor 54, and surely prevents the resin insulating layers 35 and 36 from delaminating from the upper portion of the conformal via conductor 54.

(2) In the multilayer wiring board 10 according to the embodiment, the tip end 51A of the glass fiber constituting the glass cloth 51 projects from the inner wall surface of the via hole 53 in the resin insulating layers 33 and 34. The anchor portion 58 is narrowly constricted at the position corresponding to the projecting portion 59 of the glass cloth 51. This surely secures the conformal via conductor 54 with the projecting portion 59 of the glass cloth 51 to prevent missing via where, for example, the conformal via conductor 54 comes off from inside of the via hole 53. The narrowly constricted shape latches the anchor portion 58 in the conformal via conductor 54 to surely prevent delamination of the resin insulating layers 35 and 36. Furthermore, since the tip end 51A of the glass cloth 51 is configured to project from the inner wall surface of the via hole 53, the portion in contact with the anchor portion 58 has the increased strength to more surely secure the anchor portion 58.

(3) In the multilayer wiring board 10 according to the embodiment, the conformal via conductor 54 includes the lower side portion 54A and the upper side portion 54B. The lower side portion 54A positioned at the lower end side of the anchor portion 58 is formed to have a smaller thickness than the upper side portion 54B. The conformal via conductor 54 bulges at approximately the center portion in the penetrating direction of the via hole 53. This ensures a large space inside of the conformal via conductor 54 at the lower side portion to surely form the anchor portion 58 with the bulged lower end side. In this embodiment, the lower end side of the anchor portion 58 bulges to have a thickness equal to or more than twice the narrowly constricted portion, thus the anchor portion 58 is surely secured inside of the conformal via conductor 54.

The embodiment of the present invention may be modified as follows.

While in the multilayer wiring board 10 according to the embodiment, the conformal via conductor 54 is formed on the resin insulating layers 33 and 34 at the inner layer side, which is the core substrate 11 side, and the filled via conductor 56 is formed on the resin insulating layers 35 to 38 at the upper layer side, this should not be construed in a limiting sense. The conformal via conductor 54 may be formed in all the resin insulating layers 33 to 38 constituting the multilayer wiring board 10. While in the multilayer wiring board 10 according to the embodiment, only the resin insulating layers 33 and 34 at the partial inner layer side include the insulating layer containing the glass cloth 51, and the other resin insulating layers 35 to 38 include the insulating layer without containing the glass cloth 51, this should not be construed in a limiting sense. The multilayer wiring board 10 may be constituted of only the resin insulating layer containing the glass cloth 51.

Figure 10:
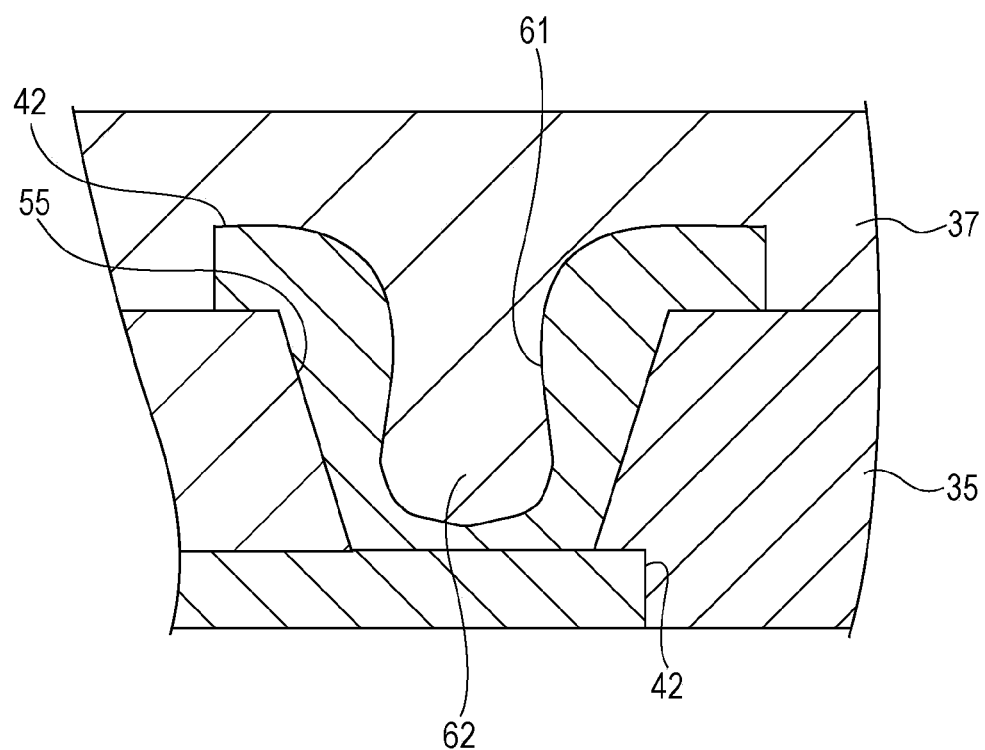
FIG. 10 is a sectional view illustrating a via conductor according to another embodiment.

While in the embodiment, the conformal via conductor 54 is formed on the resin insulating layers 33 and 34 containing the glass cloth 51, and parts of the resin insulating layers 35 and 36 at the upper layer side are filled up inside of the conformal via conductor 54 to form the anchor portion 58, this should not be construed in a limiting sense. In the via hole 55, for example, formed in the resin insulating layer 35 without containing the glass cloth 51, adjusting the plating condition may form a conformal conductor 61 illustrated in FIG. 10. The conformal conductor 61 in FIG. 10 is formed to have a larger thickness at the upper layer side than at the lower layer side. This conformal conductor 61 has an expanded space inside at the lower side portion in which a part of the resin insulating layer 37 at the upper layer side is filled up, thus an anchor portion 62 is formed. This anchor portion 62 also bulges larger at the lower end side than at the upper end side in the radially outward direction of the via hole 53. The multilayer wiring board thus configured also ensures sufficient close contact strength between the conformal conductor 61 and the resin insulating layer 37.

While in the multilayer wiring board 10 according to the embodiment, the conformal via conductor 54 has a larger thickness at the upper layer side than at the lower layer side, adjusting the plating condition may form the conformal via conductor 54 with approximately the uniform thickness.

While in the multilayer wiring board 10 according to the embodiment, it is embodied in the conformal via conductor 54 as the conformal type conductor, this should not be construed in a limiting sense. In the multilayer wiring board, it may be embodied in a conductor (such as a through-hole conductor) configured to penetrate a plurality of resin insulating layers as the conformal type conductor.

While in the embodiment, it is embodied as the multilayer wiring board 10 with the core substrate 11, the present invention may be embodied as a coreless wiring board without the core substrate 11.

The configuration of the multilayer wiring board 10 according to the embodiment is not limited to the ball grid array (BGA) only, and the present invention may apply to a wiring board such as the pin grid array (PGA) and the land grid array (LGA).

Next, in addition to the technical idea described in the claims, technical ideas grasped by the above-described embodiments are listed below.

(1) In means 1, the multilayer wiring board featuring that the lower end side of the anchor portion bulges to have a thickness equal to or more than twice the narrowly constricted portion.

(2) In means 1, the multilayer wiring board featuring that the conformal type conductor bulges in the radially inward direction of the through hole at approximately the center portion in the penetrating direction of the through hole.

(3) In means 1, the multilayer wiring board featuring that the resin insulating layer has a thickness of equal to or more than 90 μm.

(4) In means 1, the multilayer wiring board featuring that the conformal type conductor is constituted of a plating layer.

(5) In means 1, the multilayer wiring board featuring that the plurality of resin insulating layers and the plurality of conductor layers constitute a buildup layer, the through hole is a via hole, and the conformal type conductor is a conformal via conductor.

REFERENCE SIGNS LIST 10 multilayer wiring board
33 to 38 resin insulating layer
42 conductor layer
50 resin insulating material
51 glass cloth as inorganic fiber cloth
51A tip end of glass cloth
53, 55 via hole as through hole
54, 61 conformal via conductor as conformal type conductor
54A lower side portion
54B upper side portion
58, 62 anchor portion
59 projecting portion

What is claimed is:

1. A multilayer wiring board, comprising:
a multilayered construction where a plurality of resin insulating layers and a plurality of conductor layers are alternately layered, at least one layer that has a plurality of through hole among the resin insulating layers;
a conformal type conductor disposed in each of the plurality of through holes such that the conformal type conductor covers an inner wall surface of the through hole and defines an inner cavity with an opening at an upper layer side, and that the conformal type conductor electrically connects between the conductor layers; and
an anchor portion of a resin insulation layer layered at the upper layer side, the anchor portion positioned within the conformal type conductor and formed by filling up the inner cavity of the conformal type conductor with a part of the resin insulating layer layered at the upper layer side, wherein
the anchor portion includes a lower end side and an upper end side, the lower end side that bulges larger than the upper end side in a radially outward direction of the through hole.

2. The multilayer wiring board according to claim 1, wherein
at least one layer among the resin insulating layers includes an inorganic fiber cloth in an inner layer portion of resin insulating material,
a projecting portion is formed on the inner wall surface of the through hole disposed in the resin insulating layer, the projecting portion being a projection of a tip end of an inorganic fiber constituting the inorganic fiber cloth, and the anchor portion is narrowly constricted at a position corresponding to the projecting portion.

3. The multilayer wiring board according to claim 2, wherein the through hole has a minimum diameter at an opening diameter defined by the projecting portion.

4. The multilayer wiring board according to claim 3, wherein the conformal type conductor includes a lower side portion and an upper side portion, the lower side portion being in contact with the lower end side of the anchor portion, the lower side portion having a smaller thickness than the upper side portion.

5. The multilayer wiring board according to claim 2, wherein the conformal type conductor includes a lower side portion and an upper side portion, the lower side portion being in contact with the lower end side of the anchor portion, the lower side portion having a smaller thickness than the upper side portion.

6. The multilayer wiring board according to claim 1, wherein the conformal type conductor includes a lower side portion and an upper side portion, the lower side portion being in contact with the lower end side of the anchor portion, the lower side portion having a smaller thickness than the upper side portion.

* * * * *